United States Patent
Chen et al.

[11] Patent Number: 6,143,644
[45] Date of Patent: Nov. 7, 2000

[54] METHOD TO PREVENT PASSIVATION FROM KEYHOLE DAMAGE AND RESIST EXTRUSION

[75] Inventors: Shih-Shiung Chen; Hsiang-Chung Liu, both of Hsin-Chu, Taiwan

[73] Assignee: Taiwan Semiconductor Manufacturing Company, Hsin-Chu, Taiwan

[21] Appl. No.: 09/154,845

[22] Filed: Sep. 17, 1998

[51] Int. Cl.⁷ .............................................. H01L 21/4763
[52] U.S. Cl. ..................... 438/622; 438/619; 438/421; 438/424; 438/782
[58] Field of Search ..................... 438/421, 422, 438/424, 618, 619, 622–624, 632, 629, 637–640, 672, 675, 782

[56] References Cited

U.S. PATENT DOCUMENTS

| | | | |
|---|---|---|---|
| 4,794,021 | 12/1988 | Potter | 427/240 |
| 4,986,878 | 1/1991 | Malazgirt et al. | 156/643 |
| 5,077,234 | 12/1991 | Scoopo et al. | 437/67 |
| 5,459,093 | 10/1995 | Kuroda et al. | 438/622 |
| 5,494,853 | 2/1996 | Lur | 437/195 |
| 5,763,954 | 6/1998 | Hyakutake | 257/774 |
| 5,840,619 | 11/1998 | Hayashide | 438/622 |
| 5,985,747 | 11/1999 | Taguchi | 438/622 |

*Primary Examiner*—Charles Bowers
*Assistant Examiner*—Thanh Nguyen
*Attorney, Agent, or Firm*—George O. Saile; Stephen B. Ackerman; Rosemary L. S. Pike

[57] ABSTRACT

A new method of preventing passivation keyhole damage and resist extrusion using a hydrophillic solvent before photoresist coating is described. Semiconductor device structures are formed in and on a semiconductor substrate and covered by an insulating layer. Metal lines are formed overlying the insulating layer wherein there is a gap between two of the metal lines. A passivation layer is deposited overlying the metal lines wherein the gap is not filled completely by the passivation layer. The passivation layer is coated with a hydrophillic solvent wherein the hydrophillic solvent completely fills the gap. The passivation layer is coated with a photoresist layer which is exposed and developed to form a photoresist mask. The hydrophillic solvent completely filling the gap allows a uniform thickness photoresist layer. The passivation layer is etched away where it is not covered by the photoresist mask where a bonding pad is formed.

20 Claims, 4 Drawing Sheets

METHOD TO PREVENT PASSIVATION FROM KEYHOLE DAMAGE AND RESIST EXTRUSION

BACKGROUND OF THE INVENTION

(1) Field of the Invention

The invention relates to a method of preventing etching damage and resist extrusion to a passivation layer in the fabrication of integrated circuits, and more particularly, to a method of preventing etching damage and resist extrusion to a passivation layer by planarization with a hydrophillic solvent prior to resist coating in the manufacture of integrated circuits.

(2) Description of the Prior Art

The manufacture of integrated circuit devices has progressed to the point where half micron and sub-half micron feature sizes are common. In this technology, the top metal spacing becomes narrow enough so that keyholes are formed within the silicon oxide/silicon nitride layers covering the metal lines for certain geometrical patterns, such as at the turning points of a group of parallel metal lines.

For example, FIG. 1 illustrates a semiconductor substrate 10. Layer 14 contains various semiconductor device structures and insulating layers, not shown. The topmost metal layer 20 is shown overlying layer 14. Typically, the metal layer is passivated by first depositing a layer of silicon oxide 22 by plasma enhanced chemical vapor deposition (PECVD). Then, a silicon nitride layer 24 is deposited also by PECVD. Because the gap between the metal lines is so small, a keyhole 25 can form within the gap. After the passivation layer has been deposited, a layer of photoresist is coated over the passivation layer and the layer is patterned as desired. However, when the photoresist 30 is coated over a layer containing keyholes, the resist will flow into the keyholes resulting in a thinner resist layer in these areas, as shown in FIG. 2. During the plasma etching process, a portion of the photoresist mask will be eroded away. Because of the thinner resist in the areas of the keyholes, the passivation layer in those areas may be exposed by the eroding of the photoresist causing damage in the device areas.

After the etching step, the photoresist mask is stripped. This is typically done by a wet strip followed by $O_2$ plasma ashing. As illustrated in FIG. 3, the photoresist 31 within the keyhole may harden so that it cannot be removed by the photoresist strip. Wet chemicals 33 from the wet strip may be trapped around the hardened photoresist 31. Hard baking both before and during the plasma etch and $O_2$ plasma etching all are performed at high temperatures which can cause the resist to harden.

The wafer is then annealed in hydrogen and nitrogen at between about 400 and 450° C. This alloy process provides $H_2$ at a relatively high temperature to react with the silicon dangling bonds to stabilize the $SiO_2$—Si interface. The alloy process is used to release trapped interface charges from the plasma processes, including etching, depositing, and ashing. During this annealing, the hardened photoresist 31 may be extruded from the keyhole. The wet chemicals 33 previously trapped by the photoresist 31 would evaporate and cause defects to the device.

The most common solution to this problem is to planarize the passivation layer by covering it with a spin-on-glass layer or a silicon oxide layer deposited by subatmospheric chemical vapor deposition (SACVD) and then etching back. Then, the photoresist is coated onto the planarized layer. However, this method changes the passivation film structure requiring further device reliability qualification and dramatically increased production costs.

U.S. Pat. No. 5,494,853 to Lur discloses a method of metal patterning, including metal islands and dummy vias, that will prevent openings to tunnels and holes within a passivation layer and thereby prevent a photoresist coating from sinking into the holes. U.S. Pat. No. 5,007,234 to Scoopo et al teaches a planarization process utilizing three resist layers. U.S. Pat. No. 4,794,021 to Potter discloses a photoresist reflow technique to form a uniform thick photoresist coating. U.S. Pat. No. 4,986,878 to Malazgirt et al shows a planarization process using spin-on-glass. A much less complicated and costly method for solving the resist thinning problem over keyholes is desired.

SUMMARY OF THE INVENTION

A principal object of the present invention is to provide an effective and very manufacturable method of forming a passivation layer in the manufacture of an integrated circuit device.

A further object of the invention is to provide a method for preventing passivation damage caused by keyholes in the fabrication of integrated circuits.

A still further object of the invention is to provide a method for preventing passivation keyhole damage and resist extrusion in the fabrication of integrated circuits.

Yet another object is to provide a method for preventing passivation keyholes damage and resist extrusion using a hydrophillic solvent before photoresist coating.

In accordance with the objects of this invention a new method of preventing passivation keyhole damage and resist extrusion using a hydrophillic solvent before photoresist coating is achieved. Semiconductor device structures are formed in and on a semiconductor substrate and covered by an insulating layer. Metal lines are formed overlying the insulating layer wherein there is a gap between two of the metal lines. A passivation layer is deposited overlying the metal lines wherein the gap is not filled by the passivation layer. The passivation layer is coated with a hydrophillic solvent wherein the hydrophillic solvent fills the gap. The passivation layer is coated with a photoresist layer which is exposed and developed to form a photoresist mask. The passivation layer is etched away where it is not covered by the photoresist mask where a bonding pad is formed.

BRIEF DESCRIPTION OF THE DRAWINGS

In the accompanying drawings forming a material part of this description, there is shown.

DESCRIPTION OF THE PREFERRED EMBODIMENTS

Figure 4:
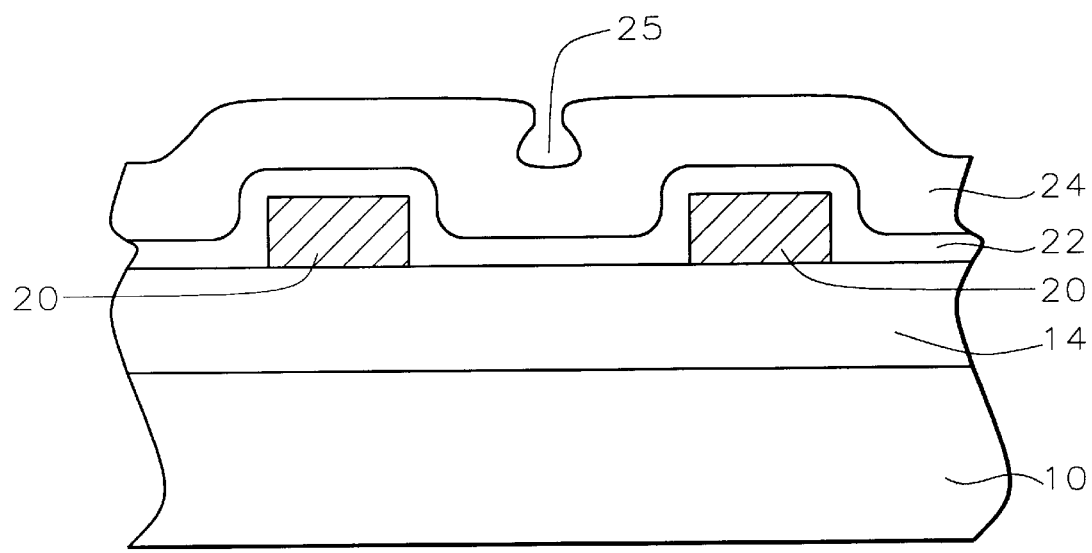
FIGS. 4 through 7 schematically illustrate in cross-sectional representation a preferred embodiment of the present invention.

Referring now more particularly to FIG. 4, there is illustrated a portion of a partially completed integrated circuit device. There is shown a semiconductor substrate 10, preferably composed of monocrystalline silicon. Semiconductor device structures are formed in and on the semiconductor substrate, as is conventional in the art. These structures may include gate electrodes and interconnection lines on the surface of the substrate and source and drain regions within the substrate. Active areas of the substrate are separated from one another by isolation regions, such as field oxide regions or shallow trench isolation. Multiple metal layers may be formed with electrical connections through openings in insulating layers separating the metal layers. All of these semiconductor device structures are formed conventionally and are represented by layer 14 in FIG. 4.

The topmost patterned metal layer is illustrated by metal lines 20. A passivation layer is now to be formed overlying the topmost metal layer. Typically, this consists of a first conformal layer of silicon oxide 22 deposited by plasma enhanced chemical vapor deposition (PECVD) followed by a gap-filling layer of silicon nitride 24 also deposited by PECVD.

Because of the narrow spacing between the metal lines for small geometries, the silicon nitride layer 24 cannot completely fill the gaps between the metal lines. The gaps between the metal lines are less between about 0.7 and 1.0 micron in width. A keyhole 25 may form in the passivation layer.

Figure 1:
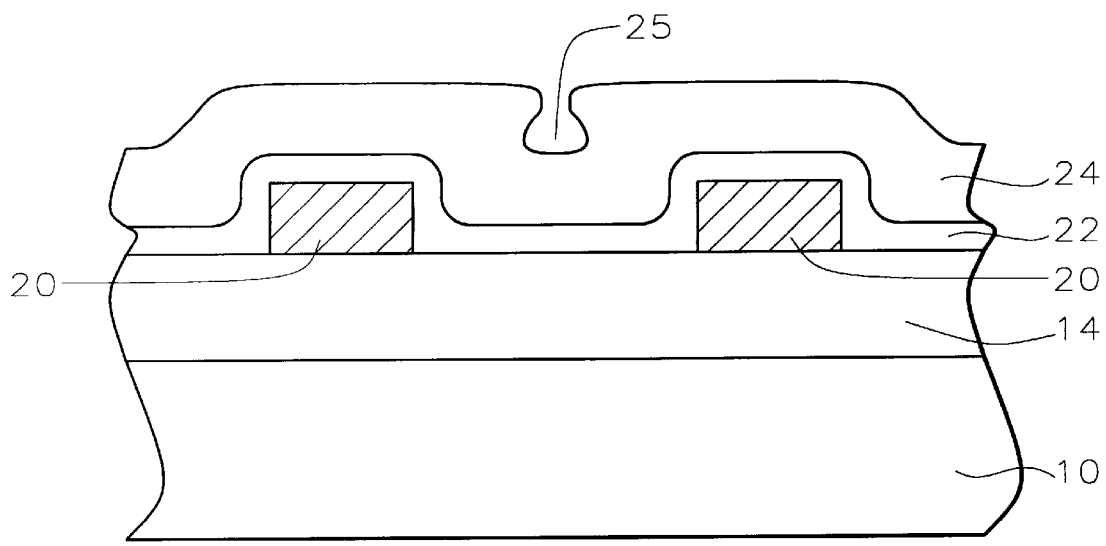
FIGS. 1 through 3 schematically illustrate in cross-sectional representation an embodiment of the prior art.
Figure 2:
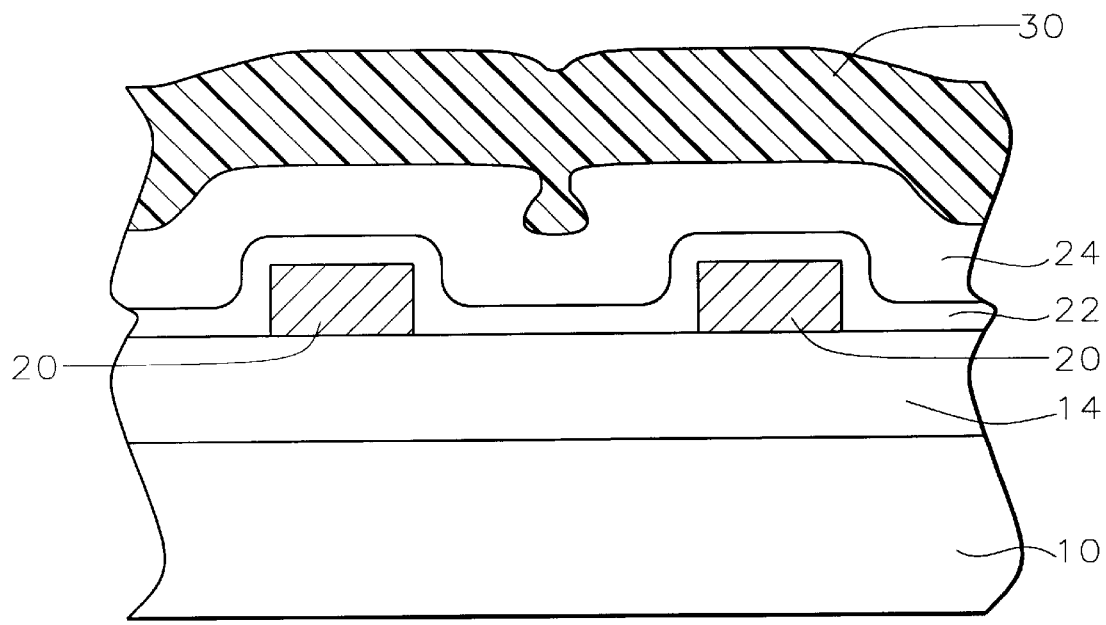
Figure 3:
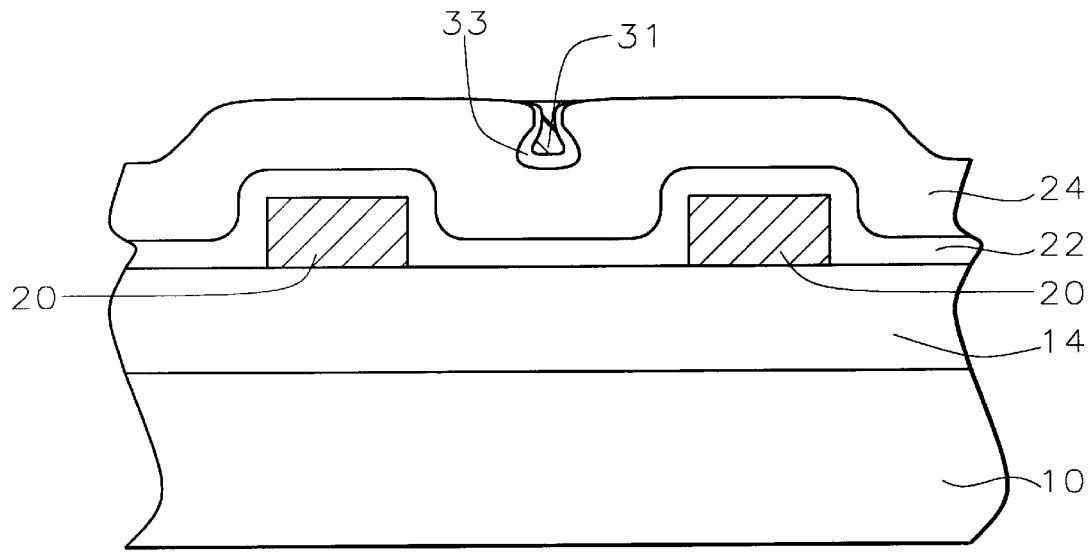

As discussed above with reference to FIG. 2, photoresist coated onto the passivation layer will sink into the keyholes causing resist thinning in these areas. The process of the present invention prevents this resist thinning by a simple and inexpensive process.

Figure 5:
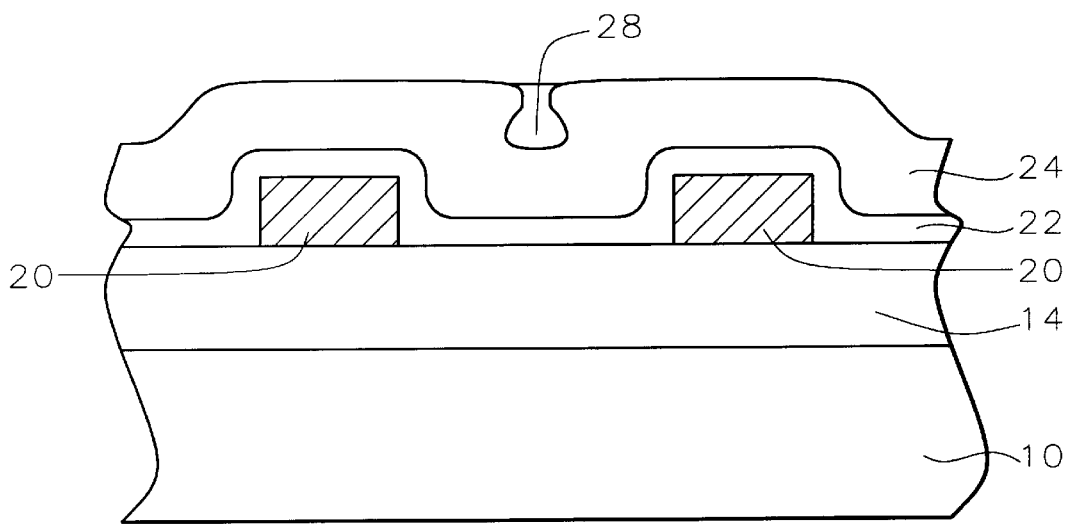

Referring now to FIG. 5, the passivation layer is planarized with a hydrophillic solvent. The hydrophillic solvent should have a boiling point greater than 250° C., such as glycerol or any other solvent that is hydrophillic at a boiling point greater than 250° C. The hydrophillic solvent 28 is coated onto the wafer by spin coating and flows into the keyholes.

Next, the photoresist layer 32 is coated onto the wafer without hexamethyldisilane (HMDS) priming. HMDS is used to promote adhesion between the resist and the substrate wafer. However, the hydrophillic solvent blocks the HMDS reaction interface.

It is recommended that a dark scribe line passivation mask be used, such as chromium. When HMDS primer is not used, the photoresist material adheres poorly to the wet passivation layer surface. This may lead to lift off of the photoresist in the scribe line area. Using a chromium mask solves this lift off problem.

The photoresist layer is coated over the passivation layer to a thickness of between about 32,000 and 35,000 Angstroms. Photoresist is hydrophobic. The hydrophillic solvent 28 within the keyholes will prevent the hydrophobic resist solvent from flowing into the keyholes. This will result in a uniform photoresist thickness over the wafer without resist thinning in the keyhole areas. The photoresist is exposed and developed as is conventional in the art to provide a photoresist mask.

Figure 6:
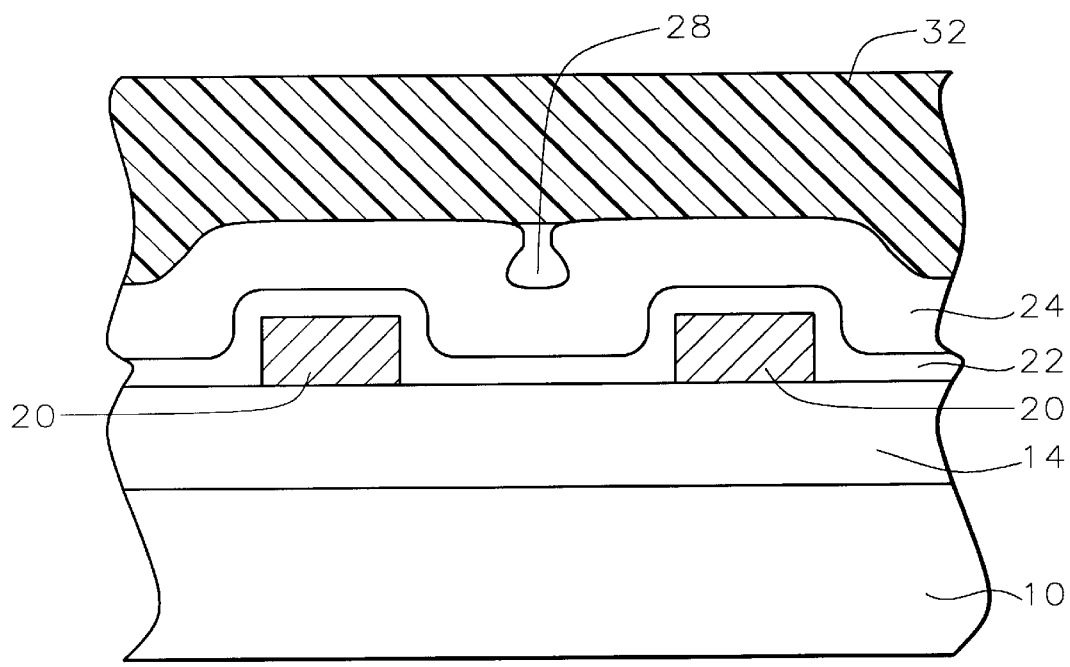
Figure 7:
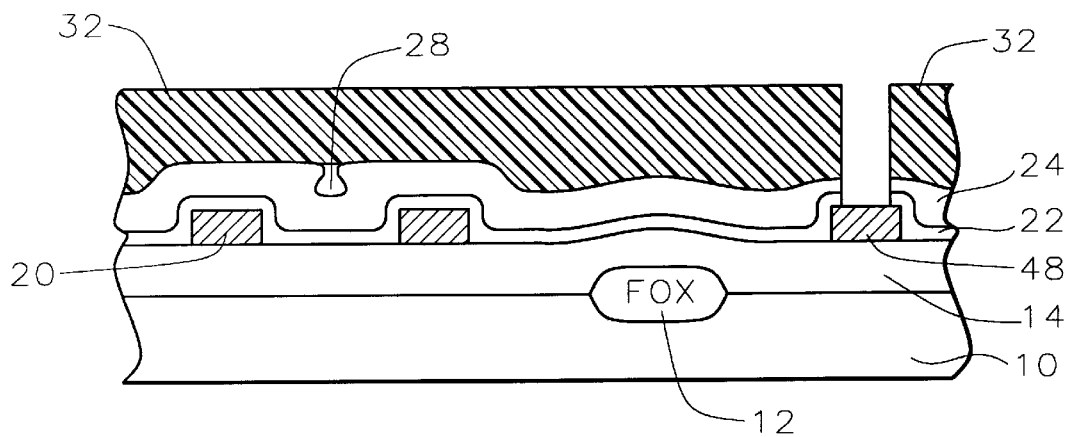

Referring now to FIG. 7, the device area shown in FIGS. 4–6 is shown here at the left side of the figure. The device area is separated by a Field OXide region 12 from the bonding pad area shown at the right side of the figure. The passivation layer is etched away where it is not covered by the photoresist mask 32 to provide an opening to the metal bonding pad 48.

The photoresist mask is stripped away, for example, using a wet chemical strip followed by $O_2$ plasma ashing. This photoresist strip also removes the hydrophillic solvent within the keyholes.

The wet stripping may comprise chemicals such as dimethylsulfoxide, monoethanalamine, and N-methyl-pyrolidane (NMP). The $O_2$ plasma ashing may comprise, for example, flowing $O_2$ gas at 500 sccm under RF power of 800 watts under pressure of 800 mTorr at a temperature of 80° C. for 60–70 minutes.

After the photoresist is stripped, the wafer is annealed in hydrogen and nitrogen at between about 400 and 450° C. to release trapped interface charges from the plasma processes, including etching, depositing, and ashing. This alloy process will not result in resist extrusion in the process of the present invention because the resist has been prevented from entering and thus becoming trapped within the keyholes.

The process of the present invention provides a simple and effective method of preventing keyhole damage and resist extrusion by planarizing the passivation layer with a hydrophillic solvent prior to photoresist coating. The presence of the hydrophillic solvent within the keyholes prevents the photoresist from sinking into the keyholes and prevents the resulting photoresist thinning. Because the photoresist has a uniform thickness across the keyholes, keyhole damage is prevented. Because the photoresist does not flow into the keyholes, resist extrusion is prevented.

Figure 8:
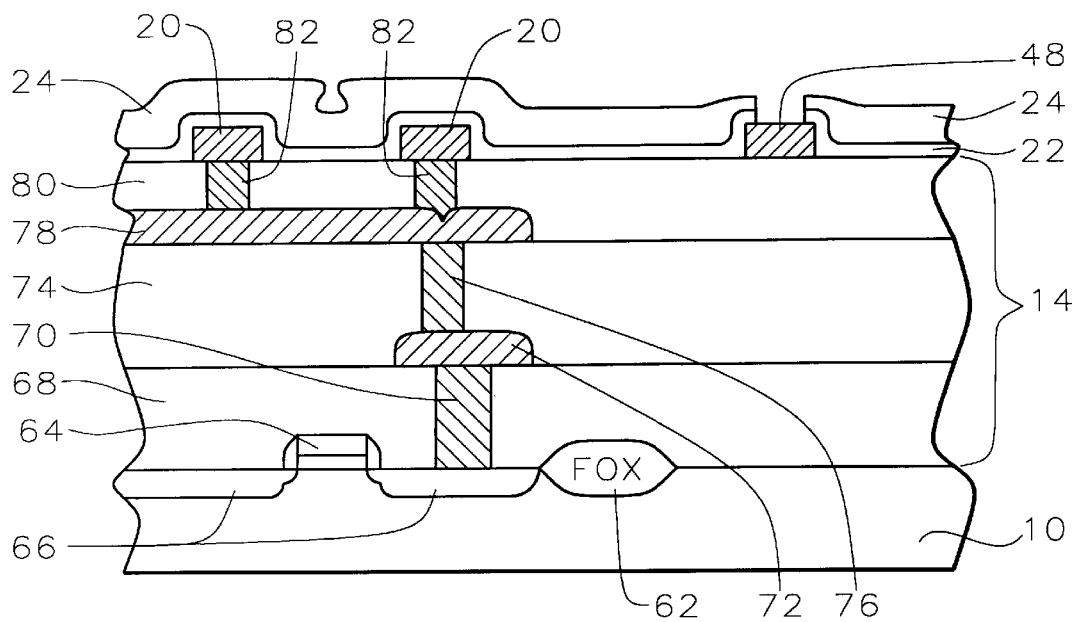
FIG. 8 schematically illustrates in cross-sectional representation a completed integrated circuit device fabricated using the process of the present invention.

FIG. 8 illustrates an example of a completed integrated circuit device fabricated according to the process of the present invention. Layer 14 in the previous figures has been expanded to show an example of the types of layers that may be formed within layer 14. In the device area, gate electrode 64 has been fabricated on the surface of the semiconductor substrate 10. Associated source and drain regions 66 have been formed adjacent to the gate within the semiconductor substrate. A first metal plug 70 has been deposited into an opening through an insulating layer 68 to one of the source and drain regions 66. Metal layer 72 forms the first patterned metal layer. An intermetal dielectric layer 74 has been deposited over the first metal layer 72. A second metal plug 76 and second metal layer 78 have been deposited and patterned to make electrical connection to the first metal layer through an opening in the intermetal dielectric layer 74. A second intermetal dielectric layer 80 has been deposited over the second metal layer 78. Third metal plug 82 is formed through an opening in the dielectric layer 80. Finally, the third metal layer is deposited and patterned to form metal lines 20 and metal bonding pad 48. The passivation layer 22/24 is deposited and patterned as described with reference to FIGS. 4–7 using the process of the present invention.

It will be understood by those skilled in the art that FIG. 8 illustrates only one example of the final structure of an integrated circuit device. Any number of metal layers or other conducting layers such as polysilicon or other materials and intervening interlevel dielectric layers may be formed in and on the semiconductor substrate. The process of the present invention for preventing keyhole damage and resist extrusion of the passivation layer over the topmost conducting layer can be used in fabricating any integrated circuit device, including, but not limited to, the example shown in FIG. 8.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an integrated circuit device comprising:

providing semiconductor device structures in and on a semiconductor substrate wherein said semiconductor device structures are covered by an insulating layer;

depositing and patterning a metal layer overlying said insulating layer to form metal lines wherein there is a gap between two of said metal lines;

depositing a passivation layer overlying said metal lines wherein said gap is not filled completely by said passivation layer;

coating said passivation layer with a hydrophillic solvent comprising glycerol wherein said hydrophillic solvent completely fills said gap;

coating said passivation layer with a photoresist layer and exposing and developing-said photoresist layer to form a photoresist mask;

etching away said passivation layer where it is not covered by said photoresist mask over one of said metal lines which forms a bonding pad; and removing said photoresist mask to complete the fabrication of said integrated circuit device.

2. The method according to claim 1 wherein said semiconductor device structures include gate electrodes and associated source and drain regions and multiple layers of metal lines and intermetal dielectric.

3. The method according to claim 1 wherein said gap between said two of said metal lines is between about 0.7 and 1.0 micron.

4. The method according to claim 1 wherein said step of depositing said passivation layer comprises:

depositing a first conformal layer of silicon oxide overlying said metal lines; and depositing as second layer of silicon nitride overlying said silicon oxide layer.

5. The method according to claim 1 wherein said hydrophillic solvent has a boiling point of greater than 250° C.

6. The method according to claim 1 wherein a keyhole is formed within said passivation layer within said gap.

7. The method according to claim 6 wherein said hydrophillic solvent sinks into said keyhole and wherein said hydrophillic solvent within said keyhole prevents said photoresist from sinking into said keyhole resulting in a uniform thickness photoresist layer.

8. The method according to claim 1 wherein a dark scribe line passivation mask design is used to form said photoresist mask.

9. A method of fabricating an integrated circuit device comprising:

providing semiconductor device structures in and on a semiconductor substrate wherein said semiconductor device structures are covered by an insulating layer;

depositing and patterning a metal layer overlying said insulating layer to form metal lines wherein there is a gap between two of said metal lines;

depositing a passivation layer overlying said metal lines wherein a keyhole is formed within said passivation layer within said gap;

coating said passivation layer with a hydrophillic solvent wherein said hydrophillic solvent flows into said keyhole;

coating said passivation layer with a photoresist layer wherein said hydrophillic solvent within said keyhole prevents said photoresist from sinking into said keyhole resulting in a uniform thickness photoresist layer;

exposing and developing said photoresist layer to form a photoresist mask;

etching away said passivation layer where it is not covered by said photoresist mask over one of said metal lines which forms a bonding pad; and removing said photoresist mask to complete the fabrication of said integrated circuit device.

10. The method according to claim 9 wherein said semiconductor device structures include gate electrodes and associated source and drain regions and multiple layers of metal lines and intermetal dielectric.

11. The method according to claim 9 wherein said gap between said two of said metal lines is between about 0.7 and 1.0 micron.

12. The method according to claim 9 wherein said step of depositing said passivation layer comprises:

depositing a first conformal layer of silicon oxide overlying said metal lines; and depositing as second layer of silicon nitride overlying said silicon oxide layer.

13. The method according to claim 9 wherein said hydrophillic solvent has a boiling point of greater than 250° C.

14. The method according to claim 9 wherein said hydrophillic solvent comprises glycerol.

15. The method according to claim 9 wherein a dark scribe line passivation mask design is used to form said photoresist mask.

16. A method of fabricating an integrated circuit device comprising:

providing gate electrodes in and on a semiconductor substrate and forming associated source and drain regions within said semiconductor substrate;

covering said gate electrodes with a first dielectric layer;

forming electrical connections to said source and drain regions and to said gate electrode by depositing a first metal layer through openings in said first dielectric layer;

forming succeeding levels of intervening dielectric layers and metal layers overlying said first metal layer with appropriate electrical connections wherein said topmost level comprises a dielectric layer;

depositing and patterning a topmost metal layer overlying said topmost dielectric layer to form metal lines wherein there is a gap between two of said metal lines;

depositing a passivation layer overlying said metal lines wherein a keyhole is formed within said passivation layer within said gap;

coating said passivation layer with a hydrophillic solvent comprising glycerol wherein said hydrophillic solvent flows into said keyhole;

coating said passivation layer with a photoresist layer wherein said hydrophillic solvent within said keyhole prevents said photoresist from sinking into said keyhole resulting in a uniform thickness photoresist layer;

exposing and developing said photoresist layer to form a photoresist mask;

etching away said passivation layer where it is not covered by said photoresist mask over one of said metal lines which forms a bonding pad; and removing said photoresist mask to complete the fabrication of said integrated circuit device.

17. The method according to claim 16 wherein said gap between said two of said metal lines is between about 0.7 and 1.0 micron.

18. The method according to claim 16 wherein said step of depositing said passivation layer comprises:

depositing a first conformal layer of silicon oxide overlying said metal lines; and depositing as second layer of silicon nitride overlying said silicon oxide layer.

19. The method according to claim 16 wherein said hydrophillic solvent has a boiling point of greater than 250° C.

20. The method according to claim 16 wherein a dark scribe line passivation mask design is used to form said photoresist mask.

* * * * *